United States Patent [19]

Arimoto et al.

[11] Patent Number: 5,065,218

[45] Date of Patent: Nov. 12, 1991

[54] LOCOS TYPE FIELD ISOLATING FILM AND SEMICONDUCTOR MEMORY DEVICE FORMED THEREWITH

[75] Inventors: Ichiro Arimoto; Masami Yamamoto; Tomoharu Mametani; Ritsuko Tsutsumi, all of Hyogo, Japan; Ritsuko Tsutsumi; Ichiro Arimoto; Masami Yamamoto, all of Hyogo, Japan

[73] Assignee: Mitsubishi Denki Kabushiki Kaisha, Tokyo, Japan

[21] Appl. No.: 370,012

[22] Filed: Jun. 23, 1989

[30] Foreign Application Priority Data

Jun. 28, 1988 [JP] Japan .................................. 63-161840
Jan. 19, 1989 [JP] Japan .................................. 1-12782
Jun. 22, 1989 [JP] Japan .................................. 1-162342

[51] Int. Cl.$^5$ ................. H01L 29/68; H01L 29/78; H01L 29/92; H01L 29/06
[52] U.S. Cl. ............................ 357/23.6; 357/23.11; 357/49; 357/50; 437/61; 437/62; 437/69; 437/73
[58] Field of Search ............... 357/49, 50, 23.6, 23.11; 437/62, 61, 69, 73

[56] References Cited

U.S. PATENT DOCUMENTS

| | | | |
|---|---|---|---|
| 3,961,999 | 6/1976 | Antipov | 357/49 |
| 4,040,878 | 8/1977 | Rowe | 357/50 |
| 4,044,454 | 8/1977 | Magdo | 357/49 |
| 4,407,696 | 10/1983 | Han et al. | 357/49 |
| 4,414,058 | 11/1983 | Mueller | 357/23.6 |
| 4,571,607 | 2/1986 | Togei | 357/23.6 |
| 4,577,394 | 3/1986 | Peel | 357/50 |
| 4,702,797 | 8/1987 | Shimano et al. | 357/23.6 |
| 4,906,595 | 3/1990 | Van der Plas et al. | 437/69 |
| 4,923,563 | 5/1990 | Lee | 437/69 |

FOREIGN PATENT DOCUMENTS

| | | | |
|---|---|---|---|
| 52-058473 | 5/1977 | Japan | 437/62 |
| 57-068033 | 4/1982 | Japan | 437/69 |
| 63-098131 | 4/1988 | Japan | 437/69 |
| 63-188952 | 8/1988 | Japan | 357/23.6 |
| 63-293875 | 11/1988 | Japan | 357/23.6 |

OTHER PUBLICATIONS

D. W. Rakowski, Oxide, Boron Isolation, May 73, pp. 3782-3783, 357*50.

Primary Examiner—Andrew J. James
Assistant Examiner—Daniel Kim
Attorney, Agent, or Firm—Lowe, Price, Leblanc and Becker

[57] ABSTRACT

A LOCOS isolation film is formed on a major surface of a semiconductor substrate. Thereafter, a new surface of the semiconductor substrate is exposed by wet etching. A resist pattern is formed on the exposed new surface. A part of the LOCOS isolation film is removed using this resist pattern, to expose the surface of the semiconductor substrate. This unsymmetrical LOCOS isolation film increases the effective area of the surface of the semiconductor substrate and preserves predetermined dielectric resistance.

1 Claim, 19 Drawing Sheets

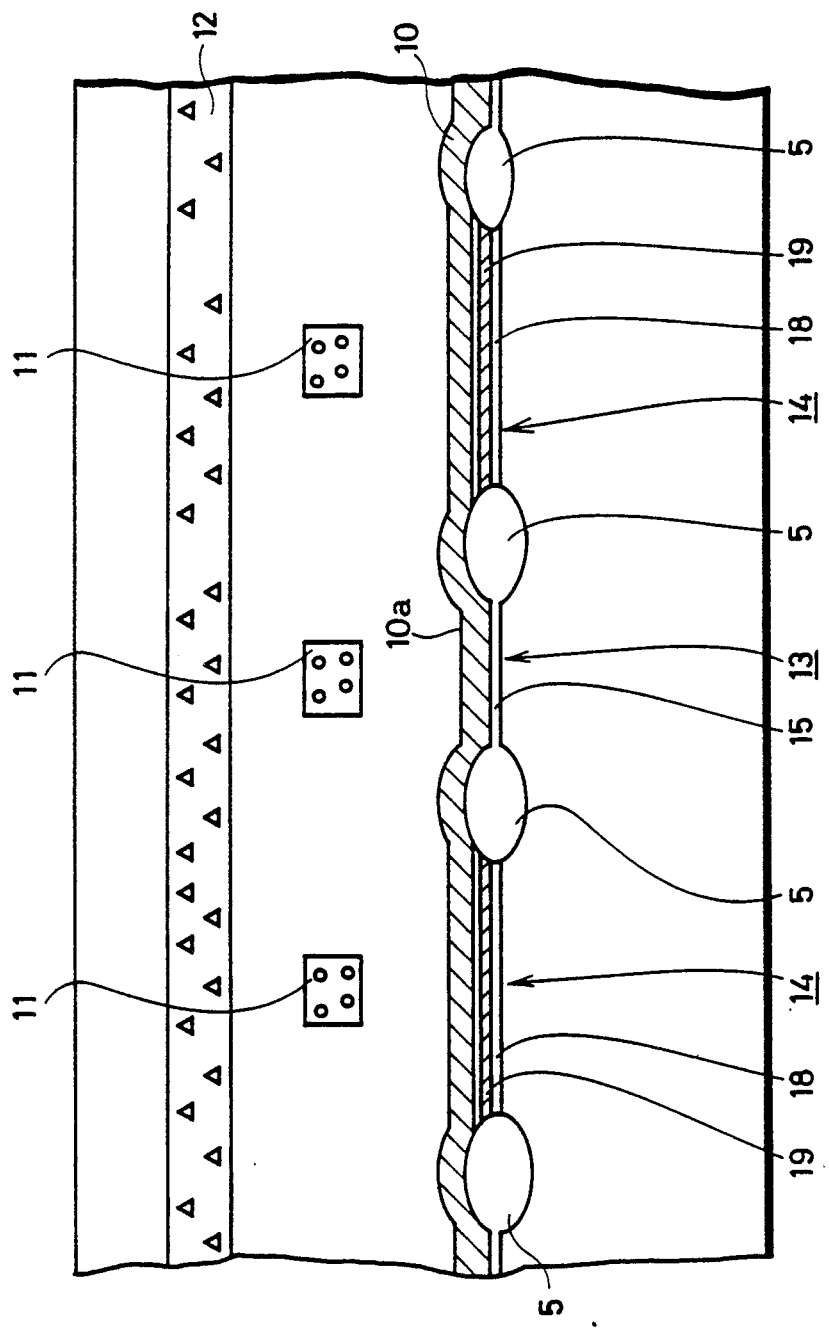

LOCOS TYPE FIELD ISOLATING FILM AND SEMICONDUCTOR MEMORY DEVICE FORMED THEREWITH

BACKGROUND OF THE INVENTION

1. Field of the Invention

The invention relates generally to LOCOS type field isolating films, and to semiconductor memory devices employing such films, and more particularly, to an improved LOCOS film structure wherein, when incorporated in a semiconductor memory device, the surface area of the film is minimized while sufficient electrical insulation between adjacent memory cells of the memory device is maintained. The invention is also related to manufacturing methods therefor.

2. Description of the Background Art

In general, a semiconductor device comprises a lot of semiconductor elements disposed on the surface of a silicon substrate, to constitute a large-scale integrated circuit. The semiconductor elements are electrically insulated and isolated by field isolation oxide films formed in a predetermined position on the surface of a semiconductor substrate.

FIG. 6 is a cross-sectional view showing a conventional field isolation oxide film formed by a LOCOS (Local Oxidation of Silicon) process. FIGS. 7A to 7D are cross-sectional views showing manufacturing processes of the field isolation oxide film shown in FIG. 6. Referring now to FIGS. 6, 7A to 7D, description is now made of a structure of the conventional field isolation oxide film.

First, as shown in FIG. 7A, an underlying oxide film 2 such as a silicon oxide film is formed on the surface of a semiconductor substrate 1. In addition, a silicon nitride film ($Si_3N_4$) 3 having resistance to oxidation is formed thereon.

Then, as shown in FIG. 7B, a resist 4 is applied on the surface of the silicon nitride film 3, to be patterned in a predetermined shape. The silicon nitride film 3 is selectively etched away utilizing this resist 4 as a mask.

Additionally, as shown in FIG. 7C, when oxidation is carried out utilizing as masks the silicon nitride films 3 patterned by etching, the underlying oxide film 2 masked is almost unchanged in thickness. However, field isolation oxide films 5 grown thick are formed in the exposed underlying oxide film 2 and on the surface of the semiconductor substrate 1 in the lower part thereof.

Thereafter, as shown in FIG. 7D, the silicon nitride films 3 are removed, so that field isolation oxide films 5 are formed on the surface of the semiconductor substrate 1.

Referring to FIG. 6, surface regions of the semiconductor substrate 1 located between the field isolation oxide films 5 respectively constitute element forming regions 6. In addition, oxide film regions 7 like a beak referred to as bird's beak extending to the element forming regions 6 are formed in both ends of each of the field isolation oxide films 5. The bird's beak 7 reduces the effective area of the element forming regions 6. Furthermore, the thicker the field isolation oxide film 5 is formed so as to improve isolation characteristics, the larger the bird's beak 7 becomes. Occurrence of the bird's beaks 7 is a large factor which prevents high integration density of the semiconductor device.

As an example of a semiconductor device having such a conventional field isolation oxide film 5, a DRAM (Dynamic Random Access Memory) will be described with reference to FIGS. 8 and 9. FIG. 8 is a partial plan view showing a memory cell array of the DRAM. FIG. 9 is a cross-sectional view taken along a line A—A in FIG. 8. Referring to FIGS. 8 and 9, a memory cell array 8 of the DRAM stores storage information corresponding to one bit. The memory cell array 8 comprises a plurality of memory cells 9 arranged in a matrix of rows and columns. A plurality of word lines 10 extending in parallel and a plurality of bit lines 11 extending in parallel in the direction perpendicularly intersecting with the word lines 10 are formed on the surface of a semiconductor substrate 1. In addition, a plurality of auxiliary word lines 12 are formed in upper layer portions of the word lines 10 in the direction which coincides with the plurality of word lines 10. The auxiliary word lines 12 are electrically connected to the word lines 10 in several portions in a longitudinal direction thereof (not shown). Such structure improves responsiveness of the word line 10, since the voltage is applied from a plurality of portions through the auxiliary word line 12. Memory cells 9 are formed in the vicinity of intersections of the word lines 10 and the bit lines 11. Each of the memory cells 9 comprises a single MOS (Metal Oxide Semiconductor) transistor 13 and a single capacitor 14. A gate electrode 10a of the MOS transistor 13 is constituted by a part of the word line 10. A gate oxide film 15 is formed on a lower layer of the gate electrode 10a. In addition, source/drain regions 16 are formed on the surface of the semiconductor substrate 1 located on both sides of the gate electrode 10. The bit line 11 is electrically connected to one of the source/drain regions 16 of the MOS transistor 13 through a contact hole 17. The capacitor 14 comprises an insulating film 18 formed on the surface of the semiconductor substrate 1 and an electrode layer 19 of a polysilicon (polycrystalline silicon) layer formed on the surface thereof. Referring to FIG. 9, the capacitor 14 is formed on the surface of the semiconductor substrate 1 between field isolation oxide films 5 formed on the surface of the semiconductor substrate 1 located on both sides thereof. Charge storage capacity is determined by the opposing area of the insulating film 18, the electrode layer 19 and the surface of the semiconductor substrate 1.

As described in the foregoing, the conventional field isolation oxide film 5 has the disadvantage that the element forming regions become narrower due to occurrence of the bird's beaks 7. This disadvantage becomes a serious problem particularly in a memory cell structure of the DRAM having the above described planer type capacitor 14. More specifically, the capacitor 14 of the DRAM is generally required to maintain predetermined capacity for storing charges of storage information. However, as the semiconductor device is highly integrated in recent years, the plane area occupied by the capacitor 14 formed on the surface of the semiconductor substrate 1 is reduced. Consequently, the capacity of the planer type capacitor 14 tends to be lowered. In addition, the bird's beaks 7 of the field isolation oxide film 5 cause capacitor 14 forming regions to become narrower, which prompts the decrease in the capacity of the capacitor 14.

SUMMARY OF THE INVENTION

An object of the present invention is to achieve miniaturization of a region where a field isolation oxide film is formed.

Another object of the present invention is to increase the usable surface area of semiconductor substrate of the semiconductor memory device between field isolating regions.

Another object of the present invention is to increase the area occupied by capacitor forming regions formed on a semiconductor substrate of a semiconductor memory device.

Still another object of the present invention is to provide a semiconductor memory device incorporating an improved field isolation oxide film.

This object is to provide a semiconductor memory device having field isolation oxide film structured to maximize the used surface area therebetween.

In accordance with a first aspect, the present invention is directed to a field isolating and insulating film for insulating and isolating element forming regions formed on a semiconductor substrate, characterized in that an insulating film for isolation formed on the surface of the semiconductor substrate is partially removed and a part of the surface of the semiconductor substrate covered with this insulating film is exposed, so that the field isolating and insulating film is formed relatively thin on one side which contacts with the element forming regions on the semiconductor substrate while being formed relatively thick on the other side.

More specifically, the field isolating and insulating film ensures the thickness required in ensuring the dielectric resistance and partially removes the side which contacts with a predetermined element forming region, to expose the surface of the semiconductor substrate. Consequently, the effective area of the predetermined element forming region is increased while holding dielectric resistance required for isolation.

In accordance with another aspect of the present invention, in the semiconductor memory device, the above described field isolating and insulating film is formed on the surface of a semiconductor substrate. A part of the field isolating and insulating film is partially removed, to form a charge storage element of a memory cell in a region where the effective area of element forming regions on the semiconductor substrate is increased. Consequently, the charge storage capacity of the charge storage element is increased.

A further object of the present invention is to strengthen adhesion of a resist pattern used in manufacturing processes of a field isolation oxide film.

In accordance with still another aspect of the present invention, in a method of manufacturing a field isolating an insulating film, a field isolation oxide film is formed by selective oxidation utilizing a silicon nitride film as a mask and then, the silicon nitride film is removed, and the surface of a substrate where the field isolation oxide film is formed is removed by wet etching. The silicon nitride film is removed by etching. In this etching process, the surface of a silicon oxide film beneath the silicon nitride film or the field isolation oxide film having an exposed surface is exposed to an etchant, to be rough. Thus, the rough surface is thereafter removed by wet etching so that a new smooth surface can be exposed. This new exposed surface has improved adhesion when it is coated with a resist. Therefore, even when a miniaturized pattern of the resist is formed, the resist can be prevented from being stripped in the patterning process or the like, resulting in an improved forming accuracy of the miniaturized pattern of an element. In particular, the process for forming a resist pattern only in a predetermined region on the field isolation oxide film and partially etching away the field isolation oxide film utilizing this resist as a mask is reliably achieved with a high accuracy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a cross-sectional view showing a structure taken along a line A-A in FIG. 8.

DESCRIPTION OF THE PREFERRED EMBODIMENTS

Figure 1:
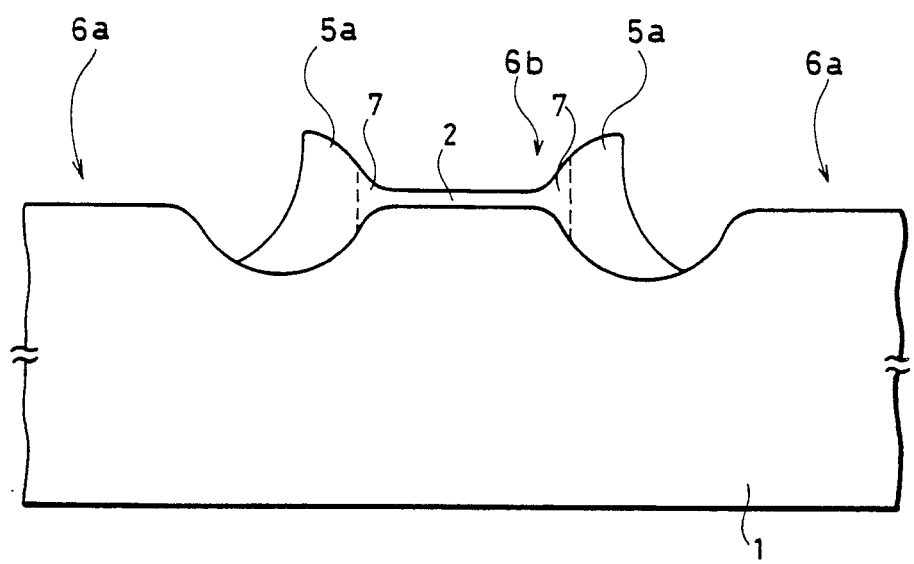
FIG. 1 is a cross-sectional view showing a structure of an unsymmetrical field isolating and insulating film according to the present invention.

Referring now to the drawings, an embodiment of the present invention will be described. FIG. 1 is a cross-sectional view showing a field isolation oxide film according to an embodiment of the present invention. In FIG. 1, field isolation oxide films 5a (referred to as unsymmetrical field isolation oxide films hereinafter) according to the present invention are formed in a predetermined region of the surface of a semiconductor substrate 1. Surface regions of the semiconductor substrate 1 surrounded by the unsymmetrical field isolation oxide films 5a respectively constitute element forming regions 6a and 6b. The unsymmetrical field isolation oxide films 5a have different cross-sectional shape on the sides which respectively contact with the predetermined element forming region 6a and the other element forming region 6b. More specifically, a part of the field isolation oxide film 5a is removed on the side of the predetermined element forming region 6a, so that the surface region of the semiconductor substrate 1 is enlarged. In addition, the field isolation oxide film 5a is formed thick on the side of the other element forming region 6b such that considerable dielectric resistance is preserved.

Such an unsymmetrical field isolation oxide film structure is formed so that the effective area of element forming regions in a region particularly having the disadvantage that the area of the element forming regions is reduced by formation of bird's beaks or the like can be increased and isolation between elements in adjacent element forming regions can be reliably achieved.

Description is now made on a structure of a DRAM using the above described unsymmetrical field isolation oxide film structure.

Figure 2:
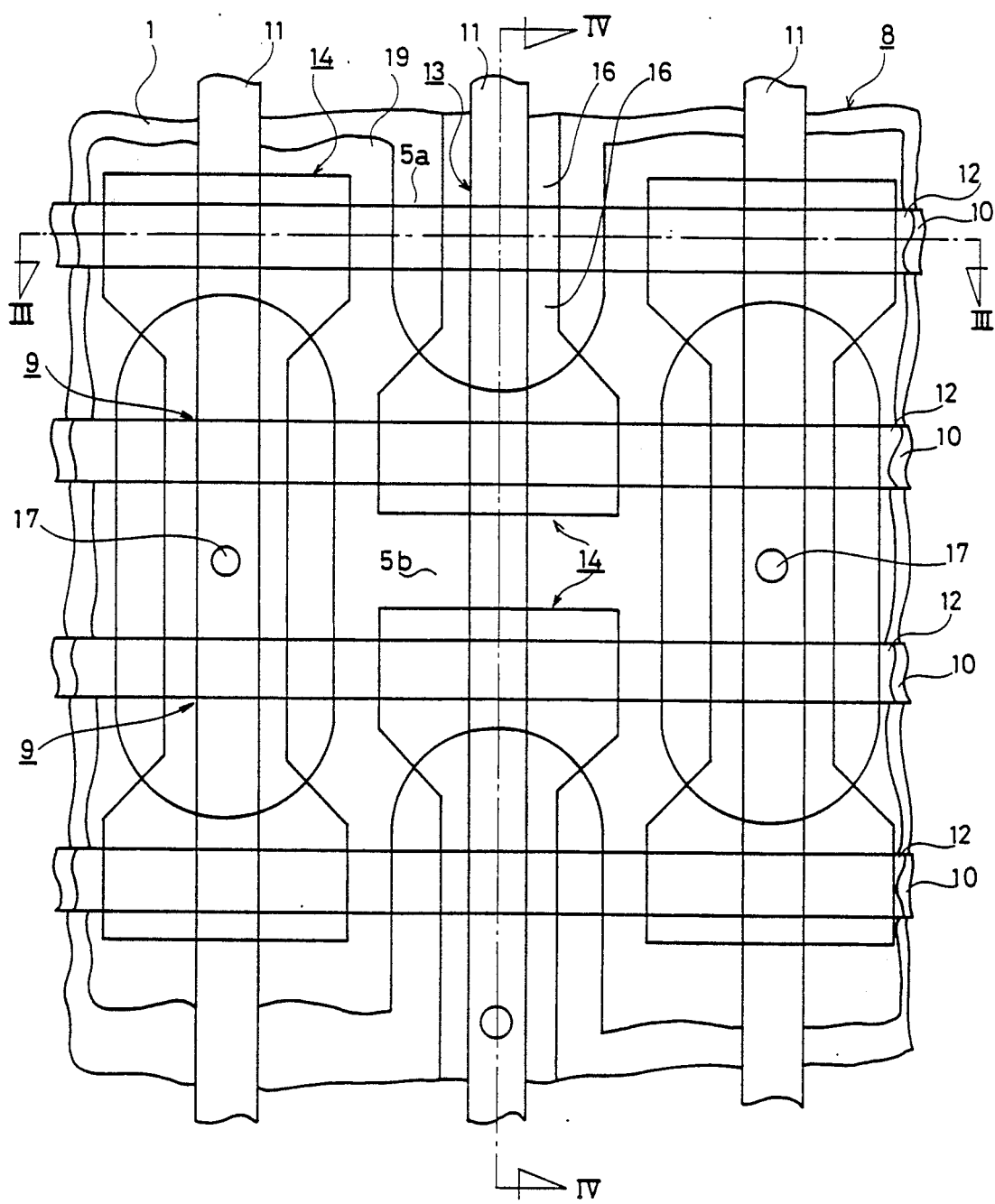
FIG. 2 is a partial plan view showing a memory cell array of a DRAM using the unsymmetrical field isolation oxide film according to the present invention.
Figure 3A:
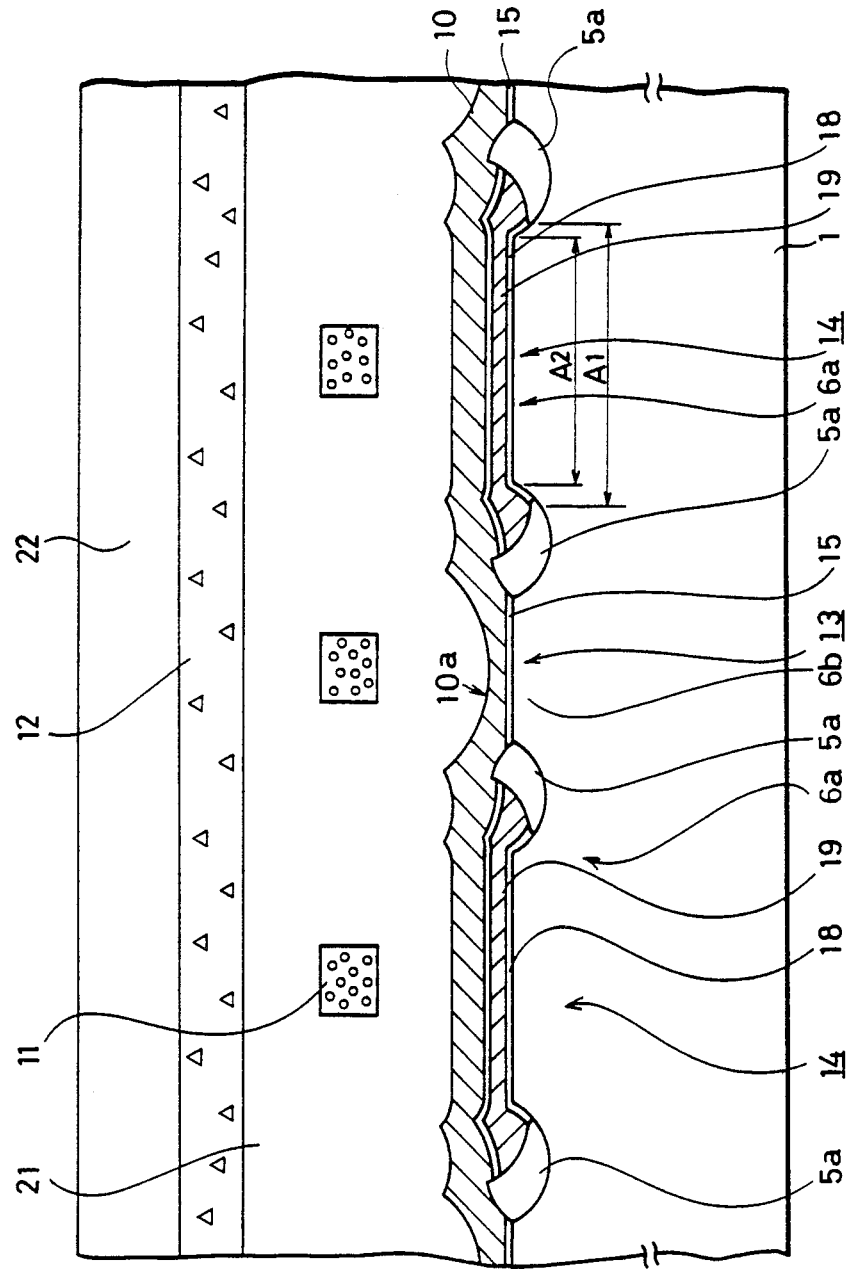
FIG. 3A is a cross-sectional view showing a structure taken along a line III—III in FIG. 2.
Figure 3B:
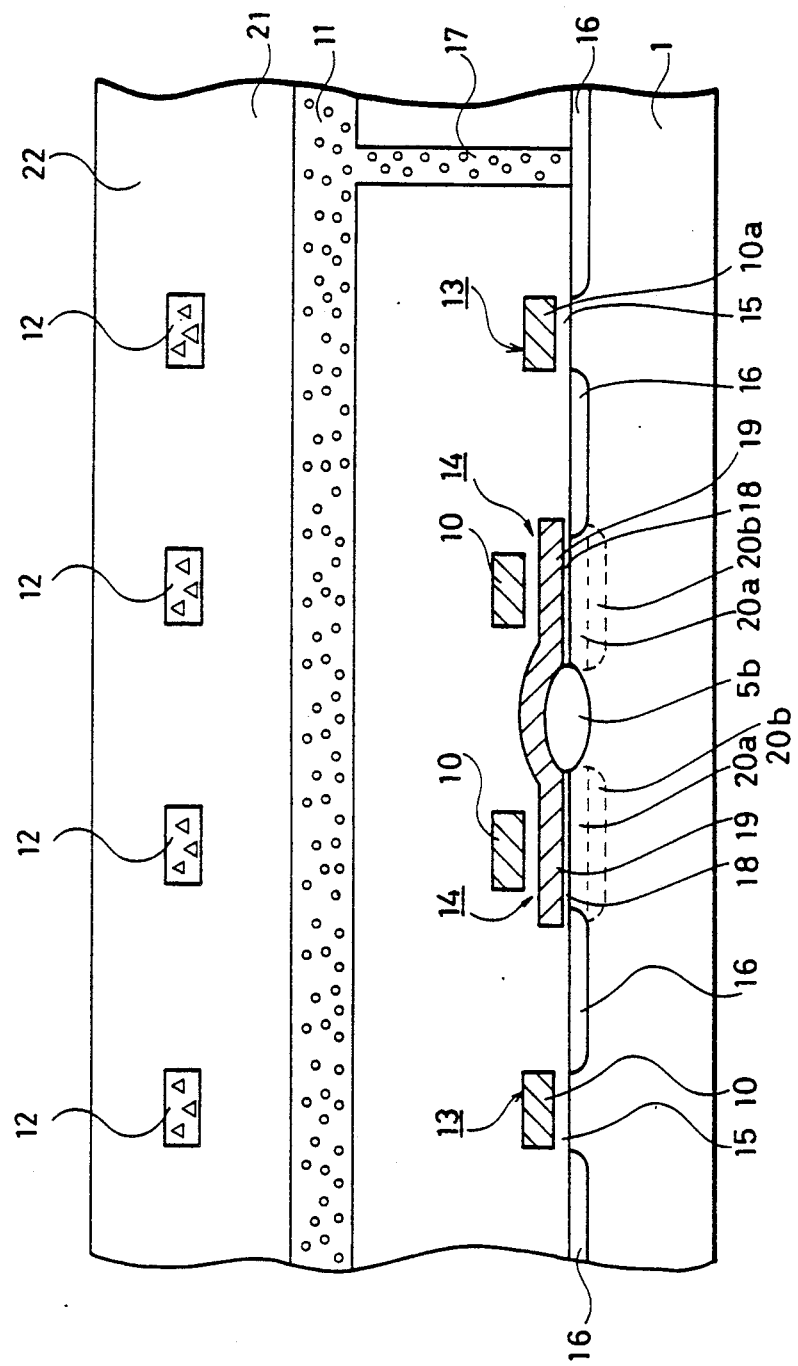
FIG. 3B is a cross-sectional view showing a structure taken along a line IV—IV in FIG. 2.

Referring to FIGS. 2, 3A and 3B, a memory cell array 8 comprises a plurality of word lines 10 extending in parallel and a plurality of bit lines 11 extending in parallel in the direction perpendicularly intersecting with the word lines 10. Auxiliary word lines 12 extending to the direction which coincides with the word lines 10 are formed in upper layer portions of the word lines 10. The auxiliary word lines 12 are electrically connected to the word lines 10 in several portions in a longitudinal direction thereof. A plurality of memory cells 9 are arranged in the vicinity of intersections of the word lines 10 and the bit lines 11. Each of the memory cells 9 comprises a single MOS transistor 13 and a single capacitor 14. The MOS transistor 13 comprises a gate oxide film 15 formed on the surface of the semiconductor substrate 1 and a gate electrode 10a further formed in the upper part thereof. The gate electrode 10a is constituted by a part of the word line 10. In addition, source/drain regions 16 are formed on the surface of the semiconductor substrate 1 in the positional relation self-aligned with the gate electrode 10a. The capacitor 14 comprises an insulating film 18 formed on the surface of the semiconductor substrate 1 and an electrode layer 19 of polysilicon formed in the upper part thereof. An impurity region 20a having the same conductivity type as that of the semiconductor substrate 1 and an impurity region 20b of high concentration having a conductivity type opposite to that of the semiconductor substrate 1 are formed on the surface of the semiconductor substrate 1 located in the lower part of the insulating film 18. The impurity regions 20a and 20b form a so-called HiC structure, to increase the capacity of the capacitor 14. More specifically, the HiC structure increases the junction capacity by forming, between the semiconductor substrate 1 and the impurity region 20a having the same conductivity type, an impurity region 20b of the opposite conductivity type having higher concentration. In addition, the bit line 11 is connected to one of the source/drain regions 16 of the MOS transistor 13 through a contact hole 17. The upper layer part of the semiconductor substrate 1, the bit line 11 and the auxiliary word line 12 are insulated by an interlayer insulating film 21. Furthermore, a silicon nitride film 22 is formed on the surface of the auxiliary word line 12.

In the above described structure, the memory cells 9 are insulated and isolated by unsymmetrical field isolation oxide films 5a. As shown in FIG. 3A, the unsymmetrical field isolation oxide films 5a are formed such that removed portions thereof are opposed to each other with respect to the element forming region 6a where the capacitor 14 is formed. When such unsymmetrical field isolation oxide films 5a are applied to capacitor forming regions 6a, the opposing area A1 of the surface of the semiconductor substrate 1 and the electrode layer 19 in the upper part thereof through the insulating film 18 of the capacitor 14 is increased, as compared with the opposing area A2 that in the conventional example as shown in FIG. 9. The increase in the opposing area increases the capacity of the capacitor. Consequently, the capacity of the capacitor of the conventional DRAM is increased and errors of storage information are reduced, so that operating characteristics of the memory can be improved. In addition, making a comparison with the capacitors having the same capacity, an element structure in the memory cell according to the present invention can be miniaturized as compared with that in the conventional memory cell. Furthermore, thick portions of the unsymmetrical field isolation oxide films 5a are arranged opposed to each other with the MOS transistor 13 interposed therebetween. The same thickness as the conventional field isolation oxide film is maintained at the thick portion of the field isolation oxide film 5a. Consequently, considerable dielectric resistance is preserved.

Description is now made on a method of manufacturing an unsymmetrical field isolation oxide film. Briefly stated, the unsymmetrical field isolation oxide film 5a is formed by a method of selectively etching away a part of the field isolation oxide film in a resist process using a photolithographic process after forming the ordinary field isolation oxide film by a LOCOS process. Prior to describing a method of manufacturing unsymmetrical field isolation oxide films 5a according to the present invention, the manufacturing processes carried out when the prior art techniques are applied to the above described manufacturing method, and the problems thereof will be described with reference to FIGS. 7A to 7G.

Figure 7A:
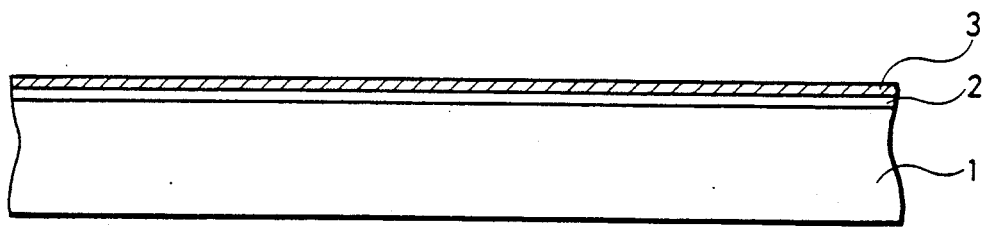
FIGS. 7A to 7D are cross-sectional views showing manufacturing processes of the field isolation oxide film formed by the conventional LOCOS process.
Figure 7B:
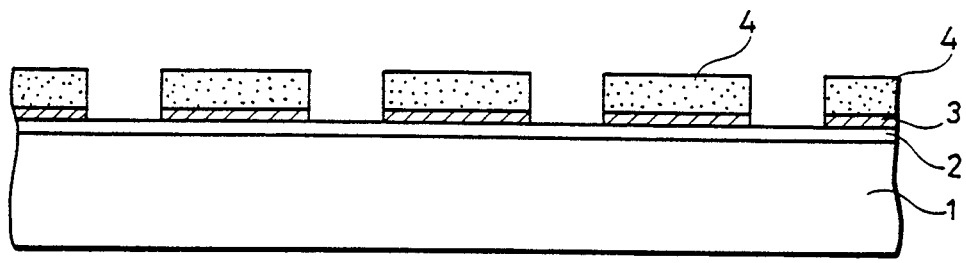
Figure 7C:
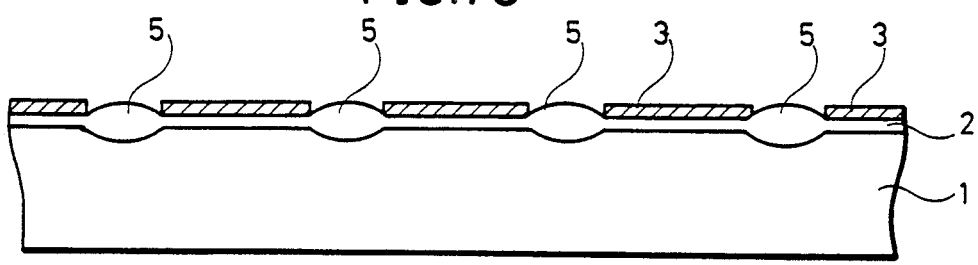

As described in the foregoing, FIGS. 7A to 7C show the manufacturing processes of a field isolation oxide film formed by a general LOCOS process using selective oxidation utilizing as a mask a silicon nitride film 3 having resistance to oxidation.

Figure 7D:
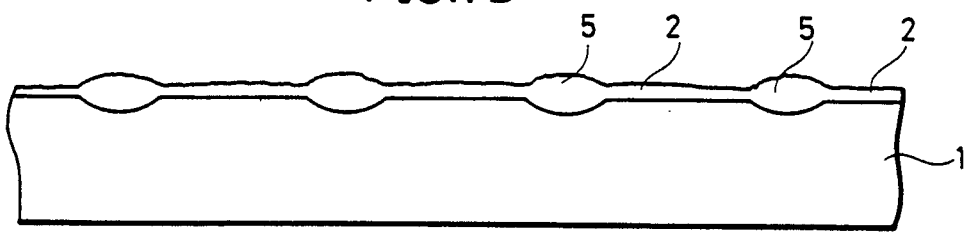

Then, as shown in FIG. 7D, the silicon nitride film 3 is removed by wet etching using a solution of hot phosphoric acid. Inorganic matter react phosphoric acid with the surface layer of silicon oxide film remains on the surface of a silicon oxide film 2 or field isolation oxide films 5a after removal, so that the surface is rough due to the effect thereof. As a result, the surface of the silicon oxide film 2 or the like is etched using hot phosphoric acid, so that the degree of smoothness of the surface is low.

Figure 7E:
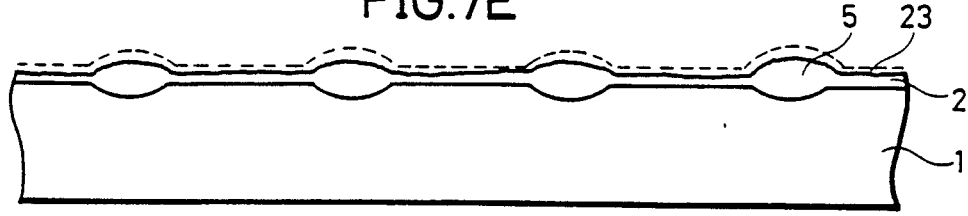
FIGS. 7E to 7G are cross-sectional views showing the manufacturing processes for explaining problems to occur when a conventional resist process is applied to the manufacturing processes of the unsymmetrical field isolating and insulating film according to the present invention.

Then, as shown in FIG. 7E, baking processing, preserving processing or the like is performed to correct the state of the rough surface of the silicon oxide film 2 or the like. However, in baking processing using a hot plate, a residue such as inorganic matter cannot be completely removed. Furthermore, in processing using ozone, foreign materials such as inorganic matter also remain, and costs for removing the foreign materials are increased. After such previous processing, a Hexamethyl di silazan (HMDS) agent 23 is applied over the surface of the silicon oxide film 2 or the like. This HMDS agent is an adhesion strengthening agent for strengthening adhesion to a resist.

Figure 7F:
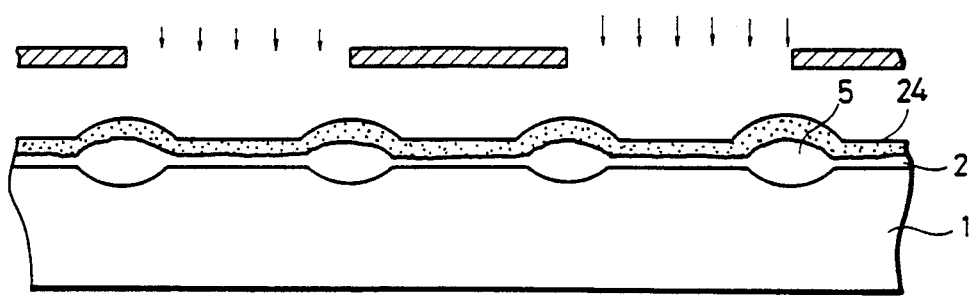

Additionally, as shown in FIG. 7F, a resist 24 is applied over the surface having the HMDS agent applied thereon, to perform exposure processing in a predetermined shape using the photolithographic process.

Figure 7G:
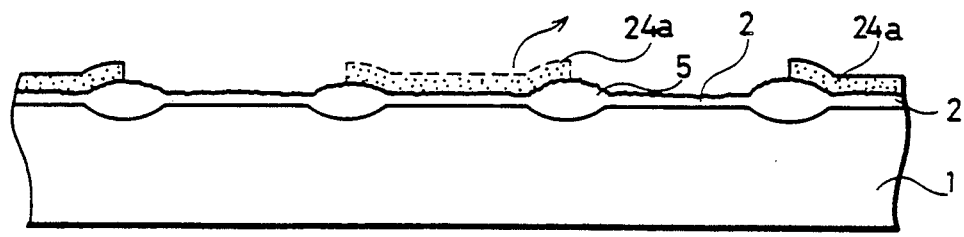
Figure 8:
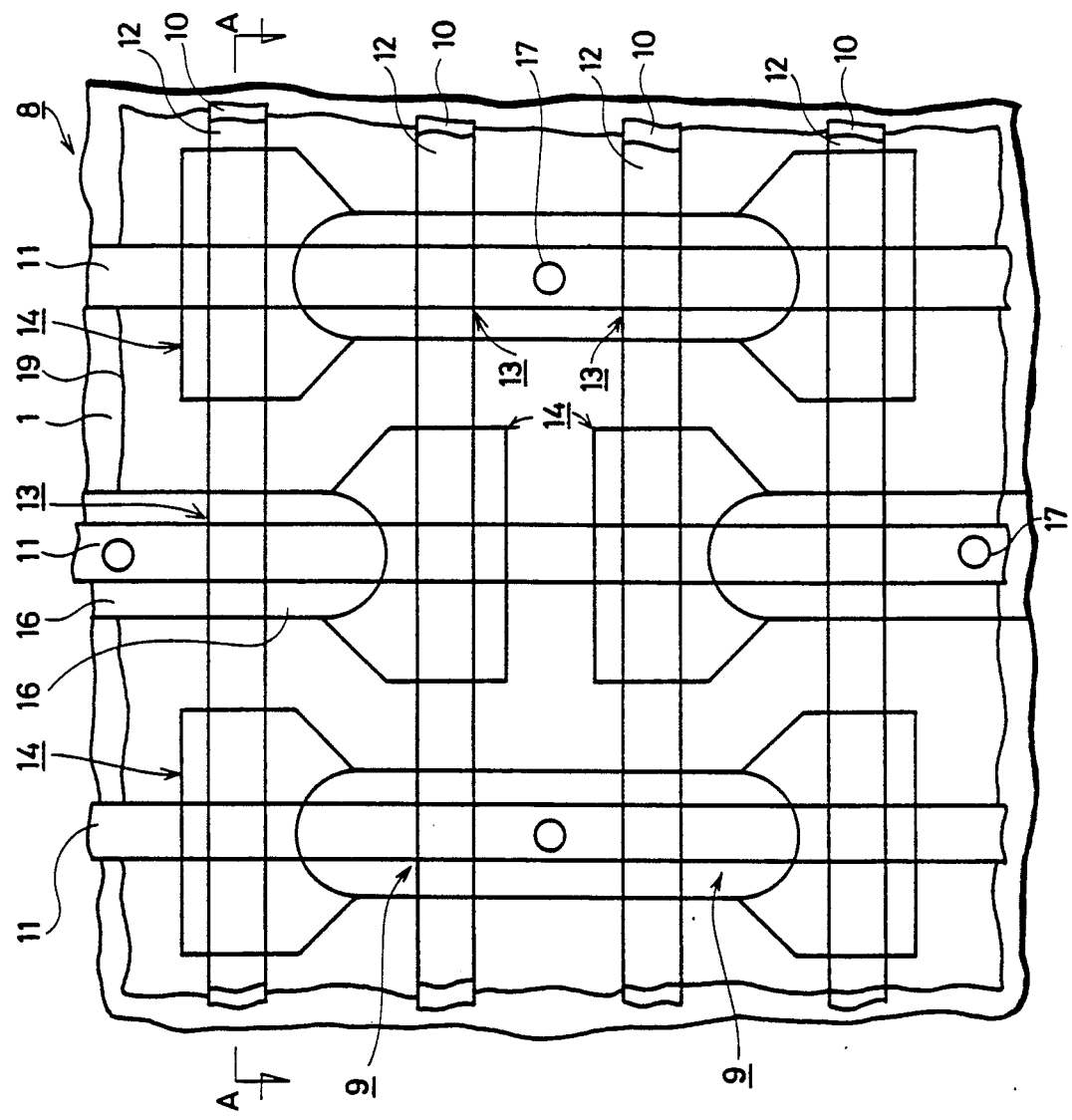
FIG. 8 is a partial plan view showing a memory cell array of a conventional DRAM.

As shown in FIG. 7G, development processing is performed, to form resist masks 24a of a predetermined shape by patterning. However, as described above, the state of the surface of the silicon oxide film 2 or the like is bad on which the resist 24 is to be applied, so that considerable adhesion strength cannot be obtained even if the HMDS agent 23 is used. Therefore, the resist pattern 24a is turn away in, for example, a dehydrating process for cleaning the surface of the wafer by using a rotary dryer or the like. In addition, even if etching processing is performed using the resist masks 24a, an etchant penetrates between the resist masks 24a and the surface of the silicon oxide film 2, to be overetched. Such a problem has been serious as the resist mask 24a is miniaturized.

Referring now to FIGS. 4A to 4S and 5A to 5S, description is made on the manufacturing processes of the memory cell of DRAM having the unsymmetrical isolation oxide film 5a according to the present invention.

Figure 4A:
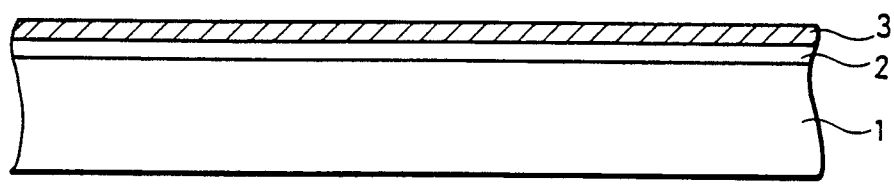
FIGS. 4A to 4S are cross-sectional views showing, in this order, the steps for manufacturing the memory cell array shown in FIG. 3A.
Figure 5A:
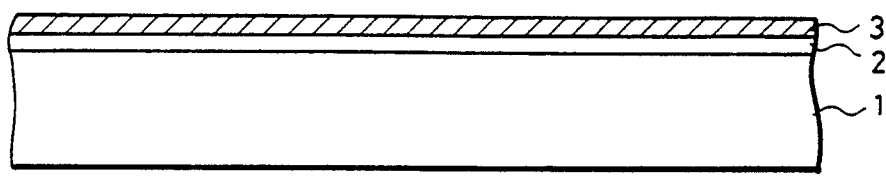
FIGS. 5A to 5S are cross-sectional views showing, in this order, the steps for manufacturing the memory cell array shown in FIG. 3B.

First, as shown in FIGS. 4A and 5A, a silicon oxide film 2 is formed to a thickness of about 500 Å on the surface of a semiconductor substrate 1. In addition, a silicon nitride film 3 is formed to a thickness of about 1000 Å on the surface of the silicon oxide film 2.

Figure 4B:
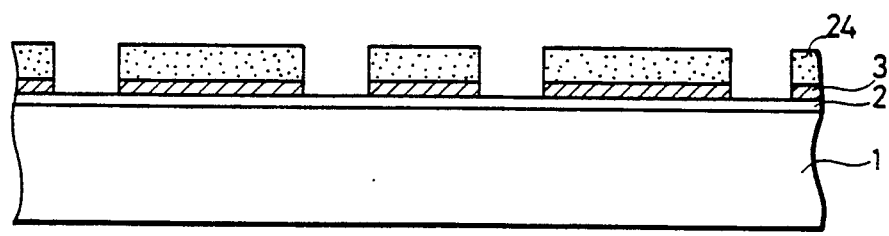
Figure 5B:
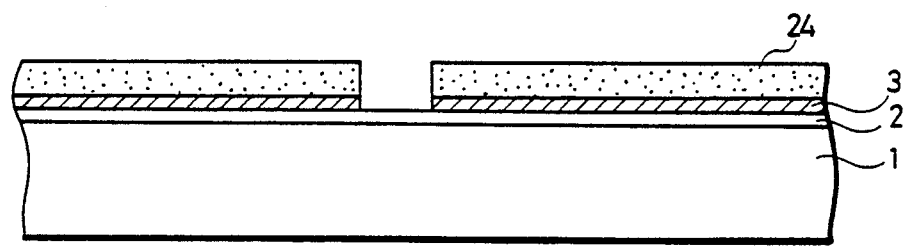

Then, as shown in FIGS. 4B and 5B, a resist 24 is applied and then, to be patterned. The silicon nitride film 3 is etched utilizing as a mask the resist 24 patterned.

Figure 4C:
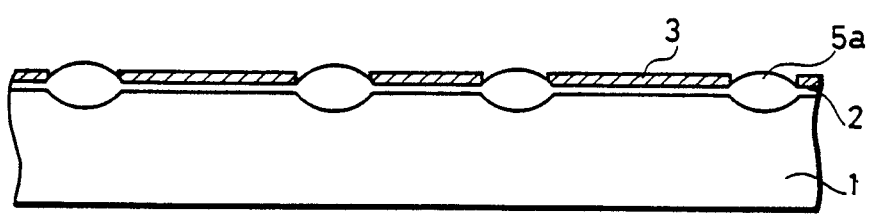
Figure 5C:
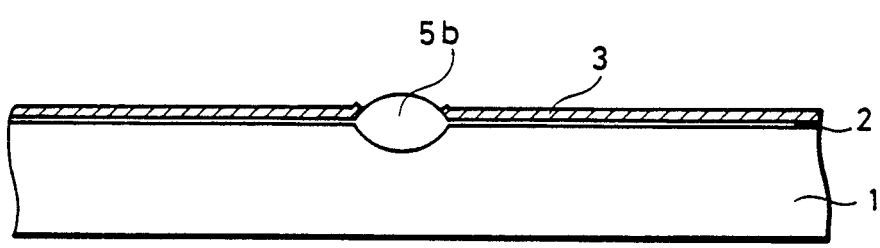

Furthermore, as shown in FIGS. 4C and 5C, the resist 24 is removed and then, oxidation processing is performed utilizing the silicon nitride films 3 as masks, to form field isolation oxide films 5a, 5b of a thickness of, for example, about 6000 Å.

Figure 4D:
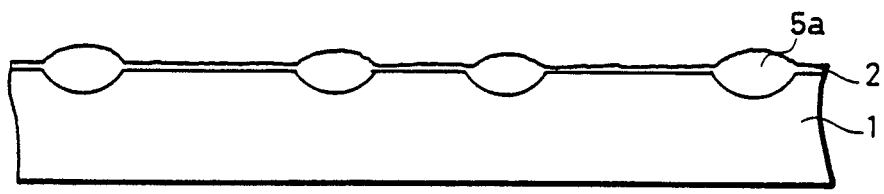
Figure 5D:
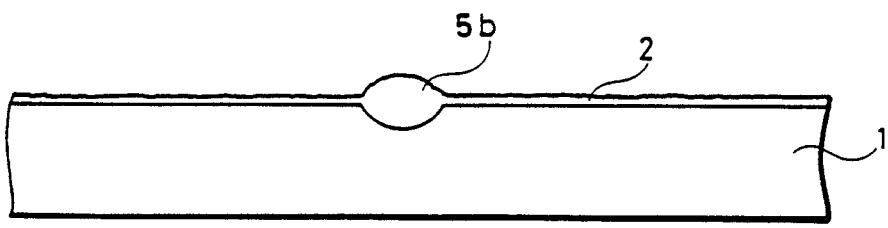

Additionally, as shown in FIGS. 4D and 5D, the silicon nitride films 3 are removed by wet etching using, for example, a solution of hot phosphoric acid. In this step, the state of the surface of the silicon oxide film 2 and the field isolation oxide films 5a, 5b is bad because foreign materials such as inorganic matter remain and the surface of the silicon oxide film 2 or the like is rough.

Figure 4E:
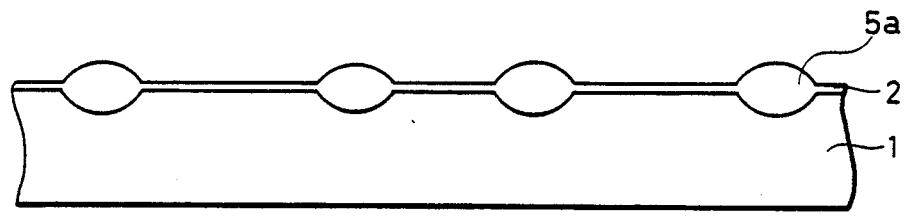
Figure 5E:
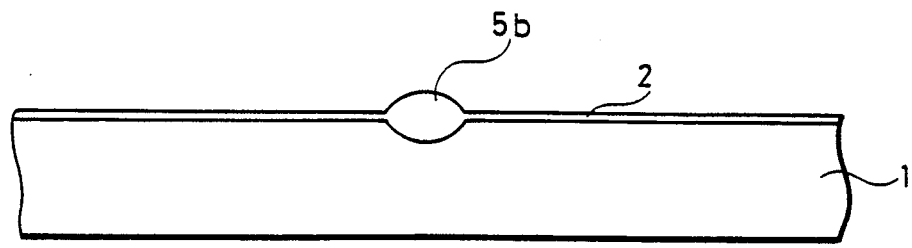

Then, as shown in FIGS. 4E and 5E, the surface, whose state is bad, of the silicon oxide film 2 and the field isolation oxide films 5a, 5b is removed by wet etching using hydrofluoric acid. As a result, a new surface of the silicon oxide film is exposed. In this process, the surface of the silicon oxide film 2 and the field isolation oxide films 5a, 5b is smoothed.

Figure 4F:
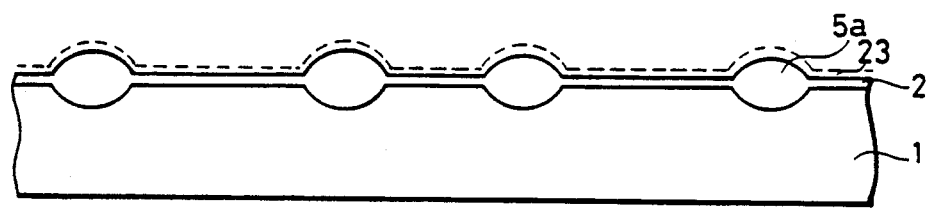
Figure 5F:
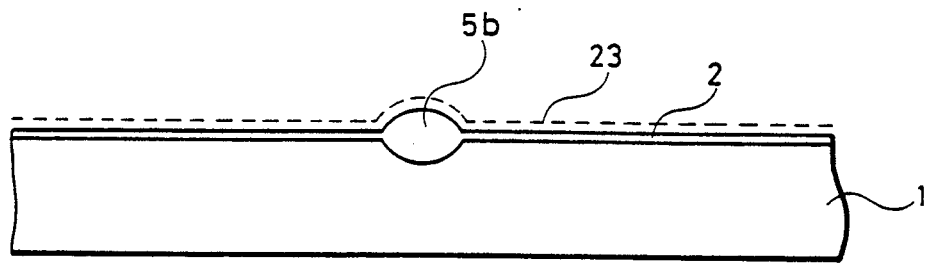

Thereafter, as shown in FIGS. 4F and 5F, a Hexamethyl di silazan (HMDS) agent 23 is applied over the surface thereof.

Figure 4G:
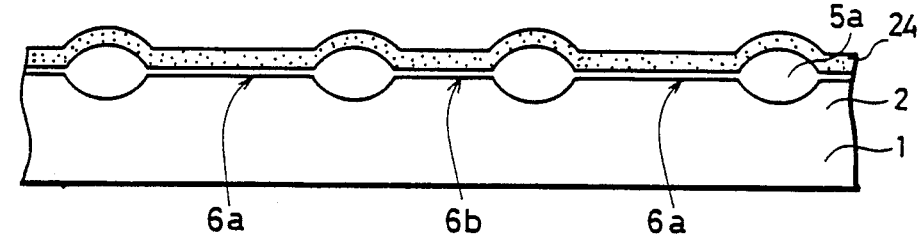
Figure 5G:
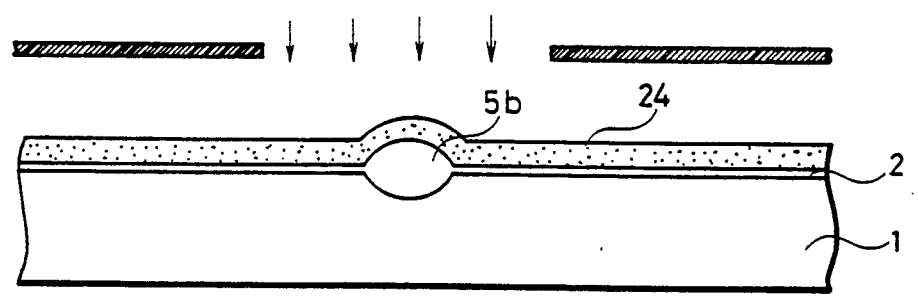

Thereafter, as shown in FIGS. 4G and 5G, a resist 24 is applied over the surface of the silicon oxide 2 and the field isolation oxide films 5a, 5b subjected to processing using the HMDS agent. The resist 24 is exposed and developed in a predetermined shape using a photolithographic process.

Figure 4H:
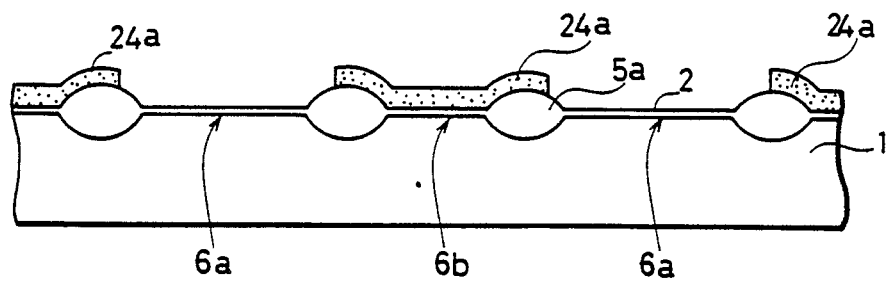
Figure 5H:
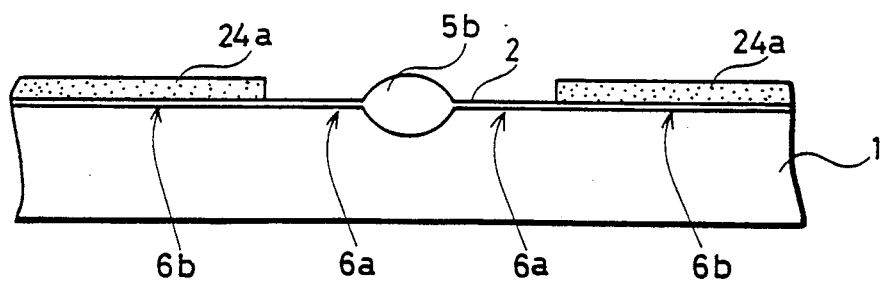

As shown in FIGS. 4H and 5H, the resist 24 is patterned, to form resist masks 24a of a predetermined shape. The resist masks 24a are formed on the smooth surface of the silicon oxide film 2 and the field isolation oxide films 5a through the HMDS agent 23 which is an adhesion strengthening agent. Therefore, adhesion is strong, so that the resist is not stripped in a patterning process thereof. In addition, the resist masks 24a are formed to partially cover the surface of the field isolation oxide films 5a.

Figure 4I:
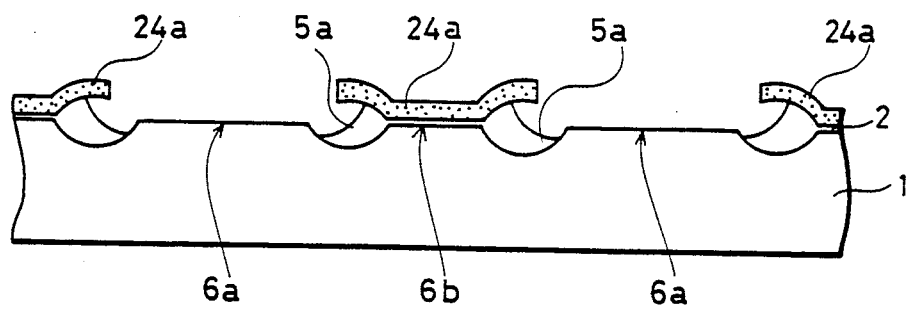
Figure 5I:
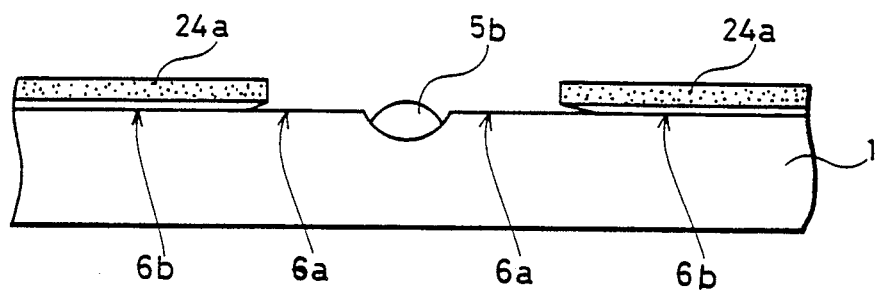

As shown in FIGS. 4I and 5I, the silicon oxide film 2 and the field isolation oxide films 5a, 5b are selectively etched away using the resist masks 24a by wet etching using a solution of a hydrofluoric acid group. 15;1BHF, 10;1HF or the like is used as the solution of a hydrofluoric acid group, to considerably control the amount of etching. In this etching process, that portion of the field isolation oxide film 5a positioned between the capacitor forming region 6a and the MOS transistor forming region 6b which is facing the capacitor forming region 6a is removed. Consequently, an unsymmetrical field isolation oxide film 5a is provided. The field isolation oxide film 5b positioned between two capacitor forming regions 6a has its surface etched approximately uniformly, so that the symmetrical shape is maintained.

Figure 4J:
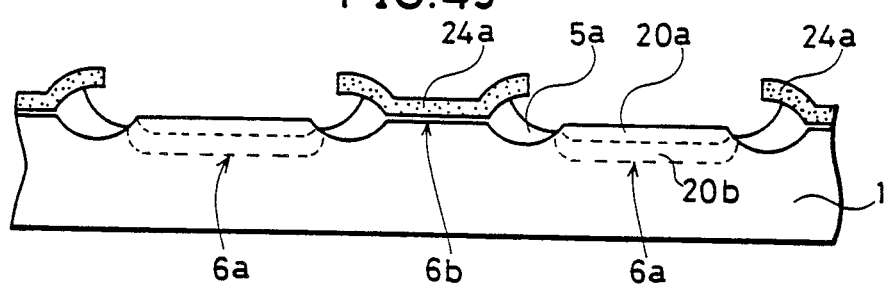
Figure 5J:
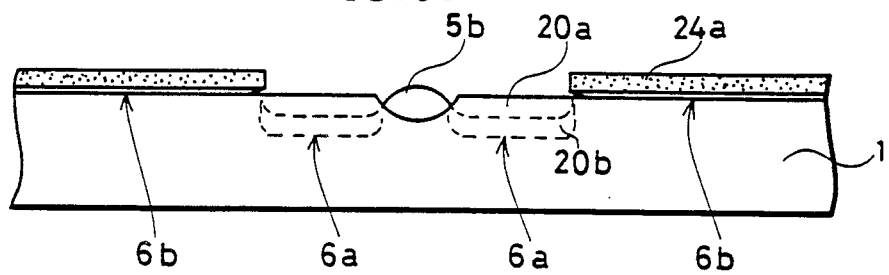

Thereafter, as shown in FIGS. 4J and 5J, an impurity region 20a having the same conductivity type as the semiconductor substrate 1 and an impurity region 20b having higher concentration of the conductivity type opposite to that of the semiconductor substrate 1 are formed by ion implantation.

Figure 4K:
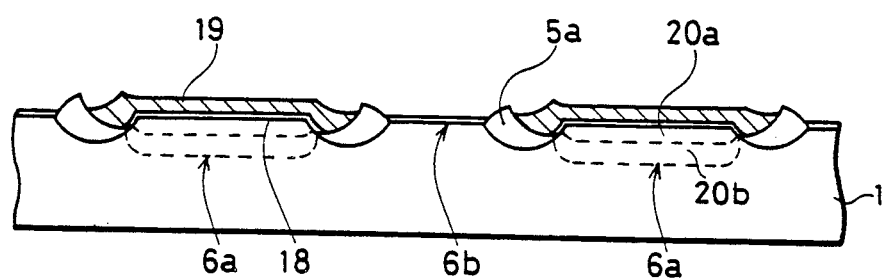
Figure 5K:
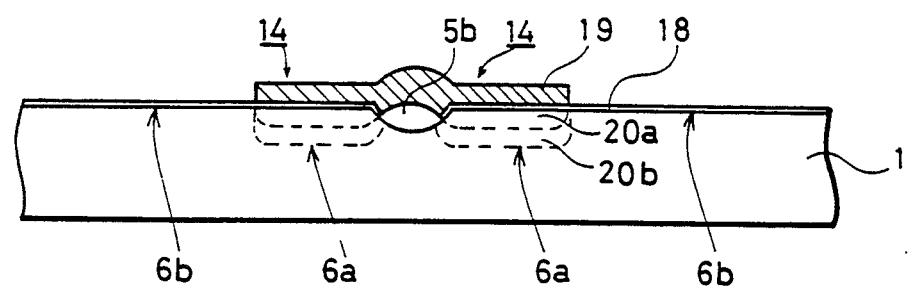

Thereafter, as shown in FIGS. 4K and 5K, the surface of the semiconductor substrate 1 is thermally oxidized to form an insulating film 18 of the capacitor. Thereafter, a polysilicon layer is deposited by CVD method on the surface of the semiconductor substrate 1. The polysilicon layer is patterned by photolithography and etching to form an electrode layer 19 of the capacitor.

Figure 4L:
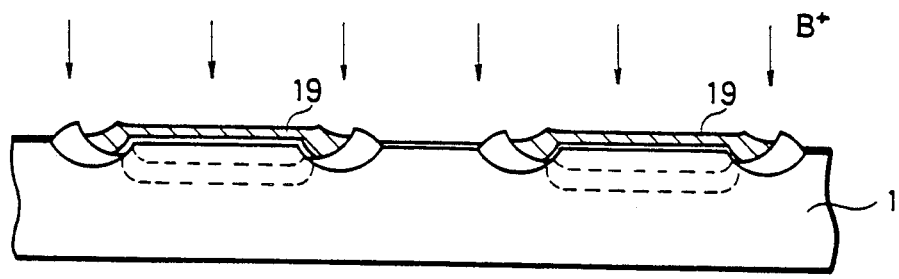
Figure 5L:
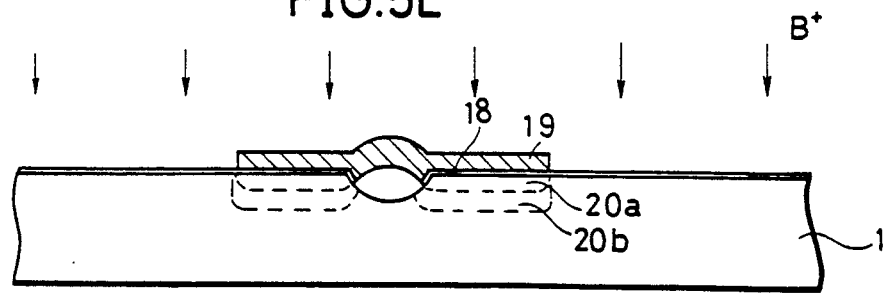

Further, as shown in FIGS. 4L and 5L, impurity ion implantation is carried out to the surface of the semiconductor substrate 1 in order to control threshold voltage of the MOS transistor 13.

Figure 4M:
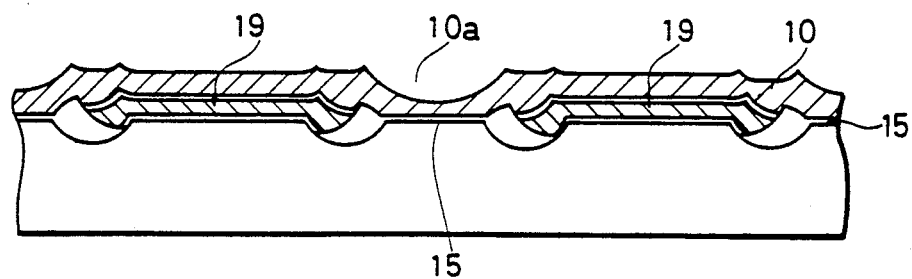
Figure 5M:
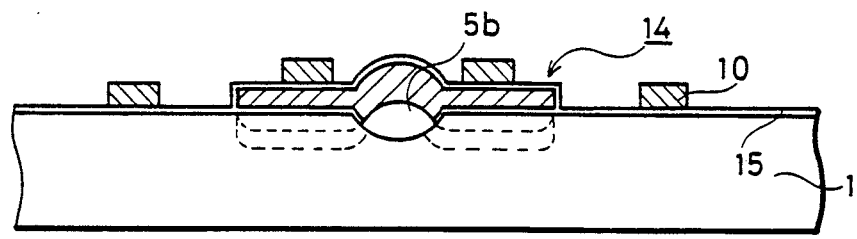

Thereafter, as shown in FIGS. 4M and 5M, the surface of the semiconductor substrate 1 is thermally oxidized to form a gate oxide film 15. Thereafter, a polysilicon layer is deposited by the CVD method on the surface of the gate oxide film 15. The polysilicon layer is patterned to form the word line 10 and the gate electrode 10a. Although not shown, gate electrodes of the transistors and interconnections of peripheral circuits are simultaneously formed.

Figure 4N:
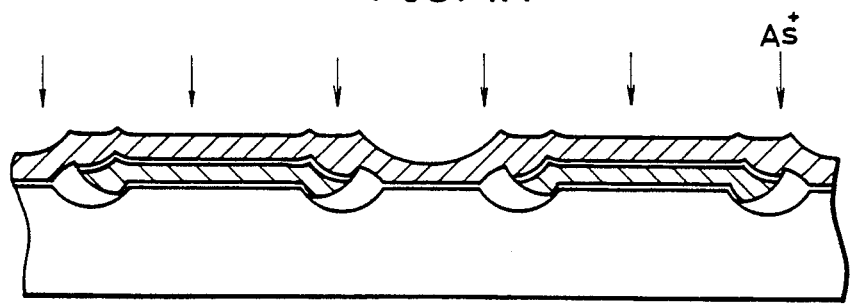
Figure 5N:
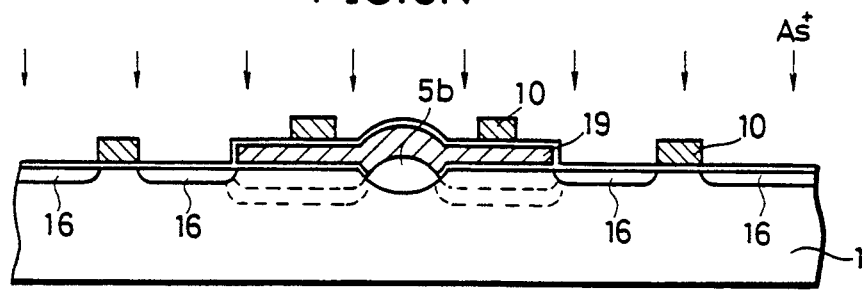

Then, as shown in FIGS. 4N and 5N, impurity ions are implanted to the surface of the semiconductor substrate 1 using the word line 10, the capacitor electrode layer 19 and the like as masks. Thereafter, thermal processing is carried out to form source/drain regions 16, 16 of the MOS transistor 13.

Figure 4O:
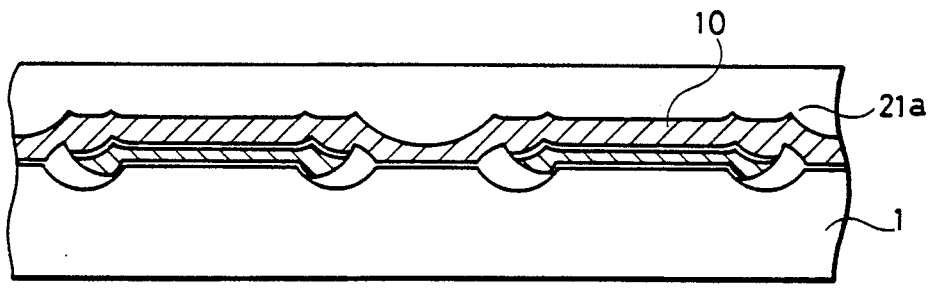
Figure 5O:
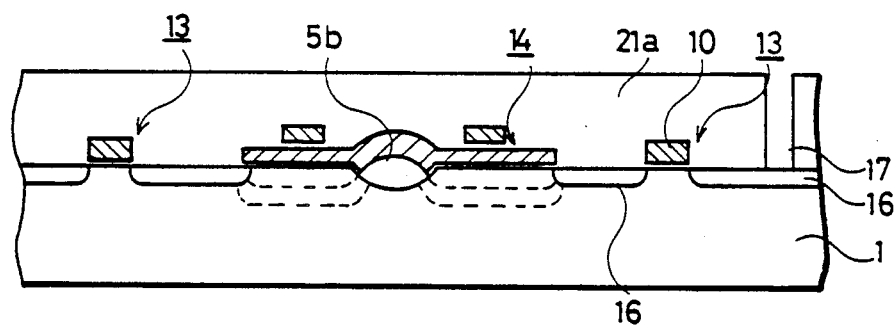

Thereafter, as shown in FIGS. 4O and 5O, first interlayer insulating film 21 is deposited on the surface of the semiconductor substrate 1 by the CVD method. A contact hole 17 reaching one of the source/drain regions 16, 16 is formed in the first interlayer insulating film 21a by photolithography and etching.

Figure 4P:
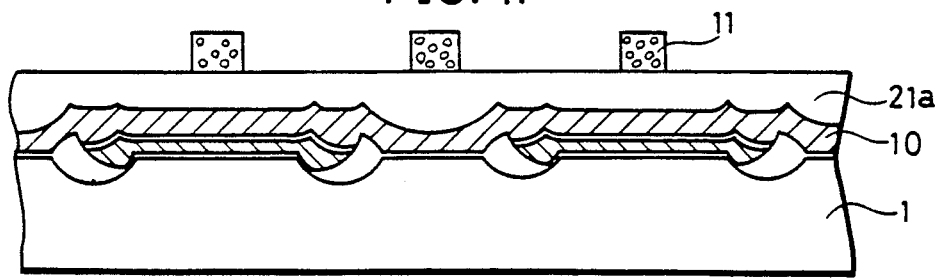
Figure 5P:
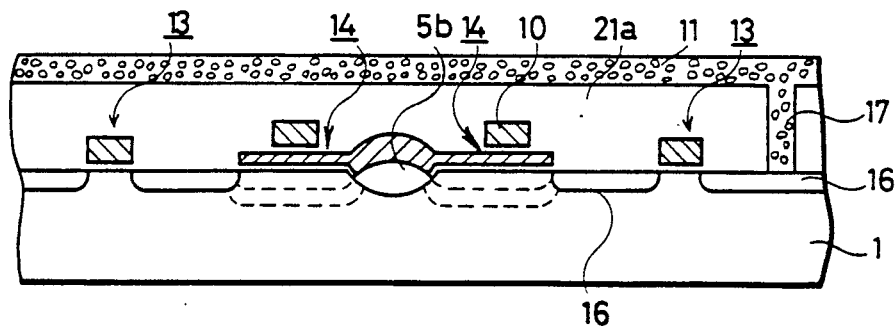

Then, as shown in FIGS. 4P and 5P, a bit line 11 is formed on the surface of the first interlayer insulating film 21a. The bit line 11 is connected to one of the source/drain regions 16, 16 of the MOS transistor 13 through the contact hole 17. On this occasion, interconnections of the peripheral circuit are formed simultaneously.

Figure 4Q:
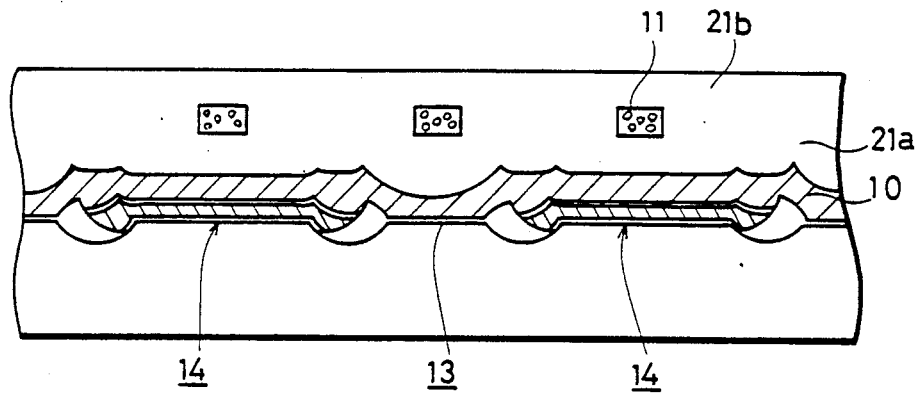
Figure 5Q:
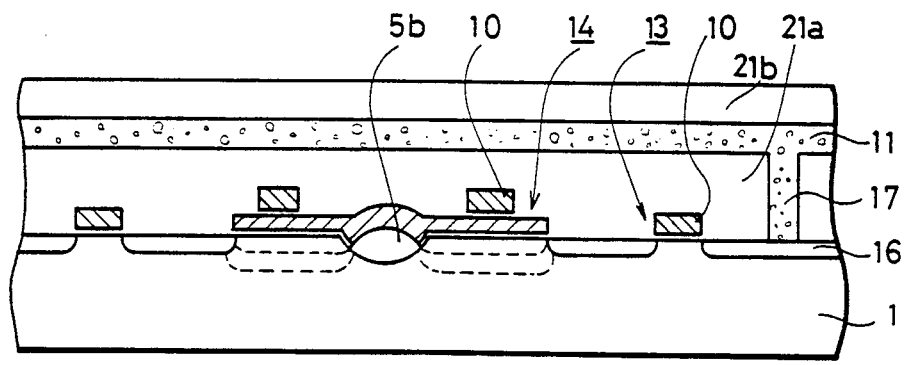

Thereafter, as shown in FIGS. 4Q and 5Q, a second interlayer insulating film 21b is formed on the surface of the first interlayer insulating film 21a, the bit line 11 and so on. Although not shown, contact holes deep enough to reach the word line 10 are formed at a number of portions in the longitudinal direction of the word line 10 in the first and second interlayer insulating films 21a and 21b.

Figure 4R:
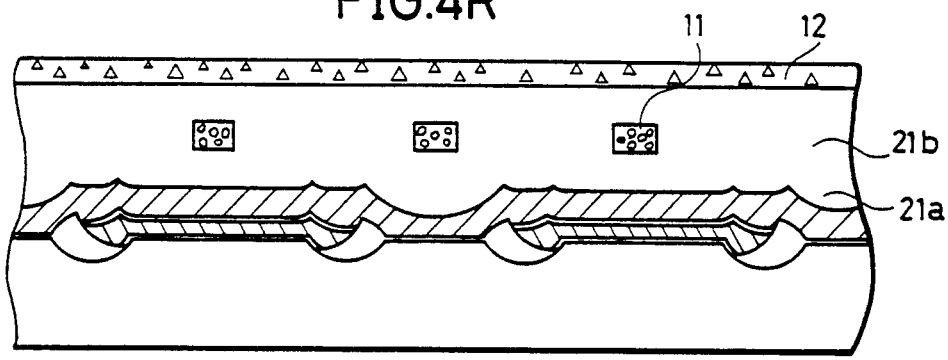
Figure 5R:
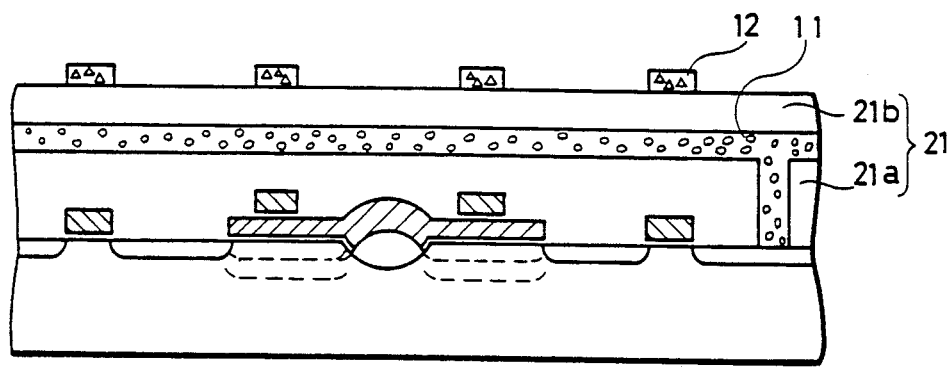

Thereafter, as shown in FIGS. 4R and 5R, an aluminum layer is deposited by sputtering. The aluminum layer is patterned by photolithography and etching to form auxiliary word lines 12 in a direction matching the plurality of word lines 10.

Figure 4S:
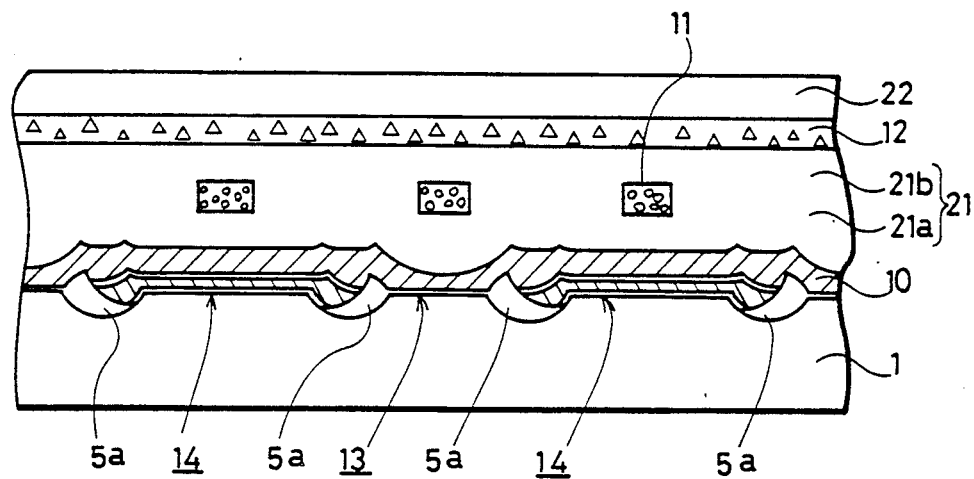
Figure 5S:
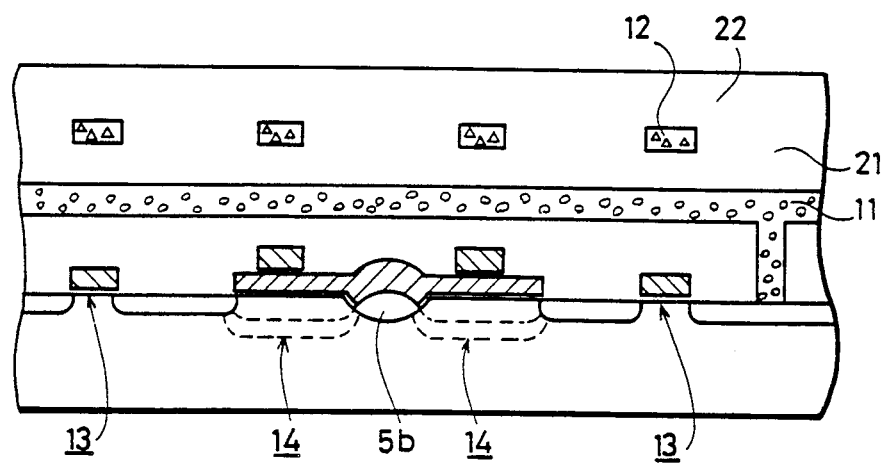
Figure 6:
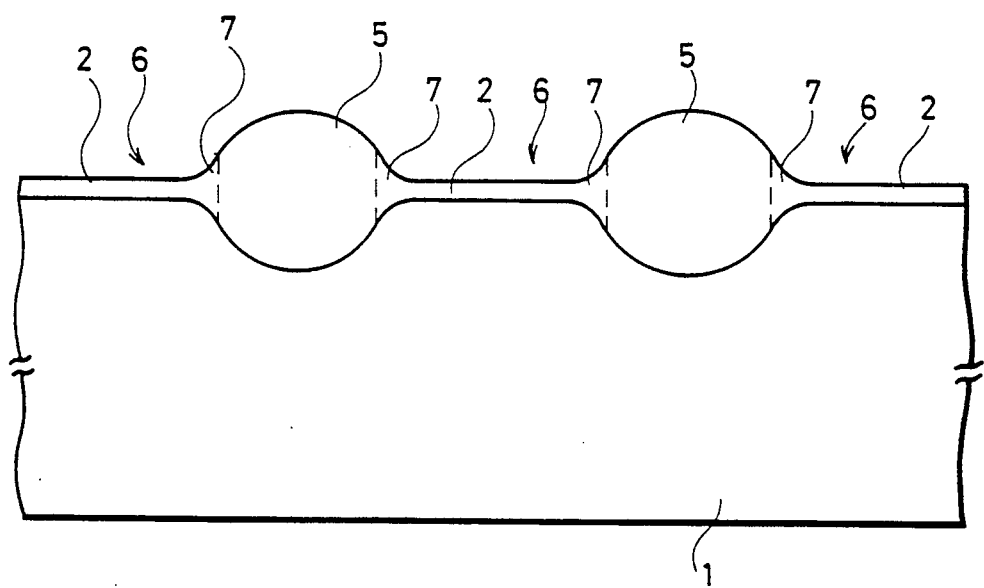
FIG. 6 is a cross-sectional view showing a structure of a field isolation oxide film formed by a conventional LOCOS process.

Finally, as shown in FIGS. 4S and 5S, a passivation film 22 is deposited on the entire surface. The passivation film 22 is selectively removed to expose a surface of an aluminum electrode at a bonding pad portion for the external electrode.

By the above described manufacturing steps, a memory cell of a DRAM is manufactured. In this memory cell, symmetrical field isolation oxide film 5b is formed between two capacitors 14 arranged facing with each other in the upper and lower directions as viewed in FIG. 2, and unsymmetrical field isolation oxide film 5a is formed between the capacitor 14 and the MOS transistor 13 opposing to each other in the left and right directions as viewed.

In the process of forming the unsymmetrical field isolation oxide film 5a, a resist pattern 24a for forming an impurity region 20a having the same conductivity type as the semiconductor substrate 1 and the impurity region 20b having higher concentration of the opposite conductivity type is formed to cover a portion of the surface of the field isolation oxide film 5a and the MOS transistor forming region 6b, as shown in FIG. 4H. The field isolation oxide film 5a is partly etched and removed by using the resist pattern 24a as masks, the unsymmetrical field oxide film 5a is formed thick in the side near the MOS transistor forming region 6b and thin in the side of the capacitor forming region 6a, as shown in FIG. 4I. Consequently, the charge storage capacity can be increased, as the area of the capacitor 14 is made larger. In addition, since thick portions of the unsymmetrical field isolation oxide film 5a are arranged opposing to each other, the MOS transistor 13 can be sufficiently insulated and maintain sufficient breakdown voltage.

Meanwhile, at a portion orthogonal intersecting with the portion shown in FIG. 4H, the resist pattern 24a is formed only to cover the MOS transistor forming region 6b, as shown in FIG. 5H.

Consequently, when the field isolation oxide film 5a is partially etched and removed by using the resist pattern 24a as masks, that portion of the field isolation oxide film 5b formed between the capacitor forming regions 6a not covered with the resist pattern 24a which is exposed on the semiconductor substrate is entirely etched and removed, so that the shape becomes symmetrical. Since the portion of the field isolation oxide film 5b which is exposed on the semiconductor substrate is entirely etched and removed, the area of the capacitor 14 can be enlarged and therefore the charge storage capacity can be increased. As it is entirely etched and removed, the field isolation oxide film 5b is reduced in thickness. However, compared with the field isolation oxide film 5a isolating the MOS transistor 13 from the capacitor 14, the insulation and the breakdown voltage of the field isolation oxide film 5b need not be very high, since it is formed between the capacitors 14. Therefore, the thickness of the field isolation oxide film 5b does not have to be thick.

Although in the above described embodiment, description was made on a method of forming a resist pattern on the surface of the silicon oxide film, whose state is bad, after removal of the silicon nitride film, it should be noted that the present invention is not limited to the same. For example, if a resist pattern formed on an aluminum layer is removed by plasma etching, the state of the surface of the aluminum layer becomes worse. When a resist on this aluminum layer is patterned again, the surface of the aluminum layer whose state is bad is subjected to etching as in the present invention, for example, subjected to wet etching using a combined solution of phosphoric acid, acetic acid and nitric acid to form a new smooth surface of aluminum and then, is patterned again, so that adhesion of the resist can be improved.

Furthermore, if a resist pattern formed on a polysilicon layer is removed by plasma etching, the state of the surface of the polysilicon layer becomes worse. Also in this case, the rough surface is removed by etching before patterning a resist again thereby to form a smooth surface, so that adhesion of the resist pattern can be strengthened.

As described in the foregoing, an unsymmetrical field isolating and insulating film according to the present invention increases a region where the surface of a semiconductor substrate is exposed, in element forming regions by partially removing a part of the field isolating and insulating film formed by a LOCOS process to expose the surface of the semiconductor substrate located in an insulating and isolating region, thereby to increase the effective area of the element forming regions. Consequently, the decrease in the area of the element forming regions caused by miniaturization of an element structure is prevented, so that high integration density of a semiconductor device is achieved.

Furthermore, in a DRAM using the unsymmetrical field isolating and insulating film, a capacitor is formed utilizing the enlarged surface of the semiconductor substrate, so that the decrease in capacity of the capacitor due to miniaturization of an element structure can be prevented and the capacity of the capacitor can be increased.

Additionally, in a method of manufacturing the unsymmetrical field isolating and insulating film, the field isolating and insulating film is formed by the LOCOS process and then, a rough surface is removed by etching. Thereafter, a resist patterning process is carried out. Consequently, adhesion of a resist to a lower surface is strengthened, so that a further miniaturized resist pattern can be formed and the accuracy of an etching process is improved.

Although the present invention has been described and illustrated in detail, it is clearly understood that the same is by way of illustration and example only and is not to be taken by way of limitation, the spirit and scope of the present invention being limited only by the terms of the appended claims

What is claimed is:

1. A semiconductor device comprising:
   a semiconductor substrate of a first conductivity type having a major surface,
   a plurality of word lines extending in parallel on the major surface of said semiconductor surface,
   a plurality of bit lines extending in a direction perpendicularly intersecting with said word liens on the major surface of said semiconductor substrate,
   memory cells formed in the vicinity of intersections of said word lines and said bit lines, said semiconductor substrate having recessed surface regions formed between adjacent said memory cells, a first configuration of insulating film for isolation provided in only a center portion of a first group of said recessed surface regions of said semiconductor substrate so that a portion of recessed surface on two sides of said first configuration of insulating film is exposed in said first group of recessed surface regions, a second configuration of insulating film for isolation provided in only a portion of each of a second group of said recessed surface regions of said semiconductor substrate so that a portion of recessed surface on one side of said second configuration of insulating film is exposed in said second group of recessed surface regions;

each of said memory cells comprising a transfer gate transistor comprising a gate electrode formed on the major surface of said semiconductor substrate through an insulating film and a pair of impurity regions formed in said semiconductor substrate in a positional relation selfaligned with said gate electrode, and a charge storage element comprising an insulating film formed on said semiconductor substrate and an electrode layer formed on the surface of said insulating film;

the transfer gate transistors and the charge storage elements in said memory cells being alternately arranged through said second configuration of insulating film for isolation in a direction in which said word lines extend, charge storage elements extending into said recessed surface regions of said second group to contact to said second configuration of insulating film for isolation, charge storage elements in adjacent memory cells being arranged through said first configuration of insulating film for isolation in a direction in which said bit lines extend, charge storage elements on two sides of each of said recessed surface regions of said first group extending into said recessed surface regions of said semiconductor substrate to contact said first configuration of insulating film for isolation.

* * * * *